(12) United States Patent
Shen et al.

(10) Patent No.: US 10,663,525 B2
(45) Date of Patent: May 26, 2020

(54) METHOD AND DEVICE FOR MONITORING STATE OF CHARGE AND STATE OF HEALTH OF LITHIUM-ION BATTERY

(71) Applicant: HUAZHONG UNIVERSITY OF SCIENCE AND TECHNOLOGY, Wuhan, Hubei (CN)

(72) Inventors: Yue Shen, Hubei (CN); Zhe Deng, Hubei (CN); Yunhui Huang, Hubei (CN)

(73) Assignee: HUAZHONG UNIVERSITY OF SCIENCE AND TECHNOLOGY, Wuhan, Hubei (CN)

( * ) Notice: Subject to any disclaimer, the term of this patent is extended or adjusted under 35 U.S.C. 154(b) by 0 days.

(21) Appl. No.: 16/083,318

(22) PCT Filed: Aug. 8, 2017

(86) PCT No.: PCT/CN2017/096345
§ 371 (c)(1),
(2) Date: Sep. 7, 2018

(87) PCT Pub. No.: WO2018/090678
PCT Pub. Date: May 24, 2018

(65) Prior Publication Data
US 2019/0049518 A1   Feb. 14, 2019

(30) Foreign Application Priority Data
Nov. 21, 2016 (CN) .......................... 2016 1 1037786

(51) Int. Cl.
*G01R 31/382* (2019.01)
*G01R 31/392* (2019.01)
(Continued)

(52) U.S. Cl.
CPC ........... *G01R 31/382* (2019.01); *G01N 29/07* (2013.01); *G01N 29/4427* (2013.01);
(Continued)

(58) Field of Classification Search
CPC ........... G01N 29/4427; G01N 29/4436; G01N 29/043; G01N 29/07; G01N 29/46; G01N 2291/0231; G01N 2291/2698
(Continued)

(56) References Cited

U.S. PATENT DOCUMENTS

| 2004/0222770 A1 | 11/2004 | Gottas | |
| 2008/0028860 A1* | 2/2008 | Refko | G01H 1/16 73/597 |

(Continued)

FOREIGN PATENT DOCUMENTS

| CN | 102928506 A | 2/2013 |
| CN | 103675702 A | 3/2014 |

(Continued)

*Primary Examiner* — Lisa M Caputo
*Assistant Examiner* — Rose M Miller
(74) *Attorney, Agent, or Firm* — Hamre, Schumann, Mueller & Larson, P.C.

(57) ABSTRACT

The present invention discloses a method and device for monitoring state of charge and state of health of a battery, and relates to the technical field of battery. The method comprises: firstly, passing ultrasonic waves through a lithium-ion battery in different SOCs at different charging and discharging currents to obtain acoustic parameters, and then establishing respective corresponding relationships between the acoustic parameters and the lithium-ion battery SOC and SOH; and secondly, monitoring the acoustic parameters of a lithium-ion battery, and then estimating SOC and SOH of the lithium-ion battery by combining the monitored acoustic parameters with the respective corresponding relationships between the acoustic parameters and the lithium-ion battery SOC and SOH. The invention further (Continued)

provides a device implementing the above method. The method and device can monitor the battery SOC and SOH in a brand new way different from the electricity parameter measurement. The method can effectively monitor SOC and SOH of lithium-ion batteries of various types and shapes and thus has a good application prospect.

6 Claims, 3 Drawing Sheets

(51) Int. Cl.
    *G01N 29/07*     (2006.01)
    *G01N 29/44*     (2006.01)
    *G01N 29/48*     (2006.01)
    *H01M 10/42*     (2006.01)
    *H01M 10/48*     (2006.01)
    *G01R 31/3832*     (2019.01)
    *H01M 10/052*     (2010.01)
    *H01M 10/0525*     (2010.01)

(52) U.S. Cl.
    CPC ......... *G01N 29/48* (2013.01); *G01R 31/3832* (2019.01); *G01R 31/392* (2019.01); *H01M 10/052* (2013.01); *H01M 10/0525* (2013.01); *H01M 10/425* (2013.01); *H01M 10/48* (2013.01); *H01M 10/488* (2013.01); *H01M 2010/4278* (2013.01)

(58) Field of Classification Search
    USPC .................. 73/602, 579, 582, 597, 598, 627
    See application file for complete search history.

(56) References Cited

U.S. PATENT DOCUMENTS

| | | | |
|---|---|---|---|
| 2008/0133156 A1* | 6/2008 | Redko | H01M 10/42 |
| | | | 702/63 |
| 2013/0091950 A1 | 4/2013 | Bernard | |
| 2013/0335094 A1* | 12/2013 | Adams | G01R 31/387 |
| | | | 324/426 |
| 2016/0197382 A1* | 7/2016 | Sood | B60L 58/16 |
| | | | 429/92 |
| 2016/0223498 A1* | 8/2016 | Steingart | G01N 29/4427 |
| 2018/0120168 A1* | 5/2018 | Hsieh | G01K 11/24 |
| 2018/0120261 A1* | 5/2018 | Hsieh | B60L 58/10 |

FOREIGN PATENT DOCUMENTS

| | | |
|---|---|---|
| CN | 103837581 A | 6/2014 |
| CN | 104502859 A | 4/2015 |
| CN | 106772063 A | 5/2017 |

* cited by examiner

METHOD AND DEVICE FOR MONITORING STATE OF CHARGE AND STATE OF HEALTH OF LITHIUM-ION BATTERY

BACKGROUND OF THE PRESENT INVENTION

Field of the Present Invention

The present invention belongs to the technical field of battery, and particularly relates to a method and device for monitoring state of charge (SOC) and state of health (SOH) of a battery.

Description of the Related Art

State of charge of a battery, also called battery remaining capacity, represents a ratio of the remaining capacity of a battery after it has been used for a period of time or after being left unused for a long period of time and the capacity of the battery in a fully charged state, and is simply referred to as SOC. There is a very complex nonlinear relationship between the battery SOC and measurable characteristics such as current and voltage of the battery, and as the service environment and the lifetime of the battery changes, it is difficult to directly measure the battery SOC. Thus, how to accurately measure the battery SOC is an international problem.

State of health of a battery is a figure of merit of a battery compared to its ideal conditions, and is simply referred to as SOH. Generally, the battery SOH decreases over time and use. Usually, a threshold is set for the battery SOH, and when the battery SOH falls below this threshold, it means that the battery is not suitable for continued use. As the battery SOH does not correspond to a particular physical quality, there is no consensus in the industry on how the battery SOH should be determined. Usually, changes in electrical parameters such as internal resistance, capacity, voltage, self-discharge speed, charging capability, number of charge-discharge cycles of the battery are used to determine the battery SOH. In actual use, due to abnormal use such as overcharge, overheating, short circuit, and mechanical damage, the battery may suffer from health problems such as flatulence and leakage, and if it is not discovered in time, the battery may burn or even explode.

Usually, the battery SOC cannot be measured directly but it can be estimated from other measurement variables in two modes: offline and online. In the offline mode, the battery is charged and discharged at a constant rate, and the battery capacity is subjected to integral computation. This mode can give precise estimation of the battery SOC, but it is protracted, and interrupts main battery performance. Therefore, researchers are looking for methods in the online mode. Currently, the online mode mainly includes methods of indirect estimation of the battery SOC such as chemical method, voltage method, current integration method, internal resistance method, Kalman filtering and neural network method.

The chemical method works only with batteries that offer access to their liquid electrolyte, such as non-sealed lead-acid batteries. The pH or specific gravity of the electrolyte can be used to indicate the battery SOC.

The voltage method converts a reading of the battery voltage into the battery SOC by comparing the known charge or discharge curve (voltage vs. SOC) of the battery. However, the voltage of the lithium ion battery is often relatively stable and changes very little as the battery SOC varies, and the battery voltage is more significantly affected by the battery current, temperature and lifetime, resulting in very inaccurate measurement of the battery SOC. This method can be made more accurate by introducing current and temperature correction coefficients, but the accuracy is still not high.

This method, also known as "ampere-hour integral method" or "coulomb counting", calculates the battery SOC by integrating the battery current over time. The method lacks a reference point and cannot measure the capacity decay of the battery due to self-discharge. In addition, the measurement error is cumulative and will gradually increases with time. Therefore, the battery SOC must be re-calibrated on a regular basis, such as by resetting the battery SOC to 100% after the battery is fully charged.

The internal resistance method is divided into alternating current (AC) internal resistance and direct current (DC) internal resistance, which are closely related to the battery SOC. The battery AC impedance is a transfer function between the battery voltage and current, which is a complex variable, represents the ability of the battery to resist AC, and is usually measured with an AC impedance meter. The battery AC impedance is greatly affected by temperature, and it is controversial whether the battery AC impedance is measured in an open circuit state after being left standing or during the battery charging and discharging. The battery DC internal resistance represents the ability of the battery to resist DC. In the actual measurement, when the battery is subjected to constant current charge or discharge in an open circuit state, the value of the DC internal resistance can be calculated by dividing the difference between the load voltage and the open-circuit voltage at the same time by the current value. For lead-acid batteries, in the late stage of discharging, the DC internal resistance is significantly increased, which can be used to estimate the battery SOC; and for nickel-metal hydride batteries and lithium-ion batteries, the change rule of the DC resistance is different from that of the lead-acid battery, and the application is less.

The core idea of the Kalman filtering method is to make the best estimate of the state of the power system in minimum variance sense. In the Kalman filtering method, the battery is regarded as a power system and the battery SOC is an internal state of the system. The core of the algorithm for estimating the battery SOC is a set of recursive equations of the covariance matrix including the battery SOC estimates and estimation errors. The covariance matrix is used to give the estimation error range. This method is applicable to the estimation of SOC of various batteries, in particular, hybrid electric vehicle batteries whose battery current fluctuates relatively violently. Compared with other methods, this method not only gives an estimate of the battery SOC, but also gives an error of the estimate of the battery SOC.

According to the neural network method, the battery is a highly nonlinear system, and it is difficult to establish an accurate mathematical model in charging and discharging processes. The neural network has non-linear basic characteristics, has parallel structure and learning ability, is capable to give corresponding output for external excitation and simulate battery dynamic characteristics so as to estimate the battery SOC. The neural network method is applicable to various batteries, and has the disadvantage that a large amount of reference data is needed for training and the estimation error is greatly affected by the training data and the training method.

In general, current battery SOC and SOH test methods are based on the measurement of electrical parameters such as current, voltage and impedance. However, due to complex influence factors of the electrical parameters of the battery, it is impossible to obtain sufficient reliable results.

Therefore, if SOC and SOH of a battery can be measured by battery characteristic parameters other than the electrical parameters, it is of great significance to improve the measurement accuracy of the SOC and promptly indicate the SOH.

SUMMARY OF THE PRESENT INVENTION

In view of the above-described problems, the present invention provides a method for monitoring SOC and SOH of a battery, which aims to establish respective correspondence relationships between acoustic parameters and SOC and SOH of a lithium-ion battery, and then monitor the SOC and SOH of the lithium-ion battery by using the acoustic parameters, thereby solving, in the prior art, the problem that results of monitoring the SOC and SOH of the lithium-ion battery based on electrical parameters are in poor reliability.

In order to achieve the above objective, according to an aspect of the present invention, there is provided a method for monitoring SOC and SOH of a battery, firstly, passing ultrasonic waves through a lithium-ion battery in different SOCs at different charging and discharging currents to obtain acoustic parameters, and then establishing respective corresponding relationships between the acoustic parameters and the lithium-ion battery SOC and SOH; and secondly, monitoring the acoustic parameters of a lithium-ion battery, and then estimating SOC and SOH of the lithium-ion battery by combining the monitored acoustic parameters with the respective corresponding relationships between the acoustic parameters and the lithium-ion battery SOC and SOH, wherein the acoustic parameters include an amplitude attenuation degree, a flight time and an acoustic fingerprint of the ultrasonic wave passing through the lithium-ion battery; the flight time refers to the time it takes for the ultrasonic wave to travel from an ultrasonic signal source to an ultrasonic signal receiver, with the ultrasonic signal source and the ultrasonic signal receiver connected to the same lithium-ion battery; and the acoustic fingerprint refers to a waveform of the ultrasonic wave passing through the lithium ion battery.

Further, the method comprises: firstly, passing ultrasonic waves with a specific frequency and amplitude through a lithium-ion battery in different SOCs at different charging and discharging currents to obtain respective amplitude attenuation degrees of the ultrasonic waves with the specific frequency and amplitude, and then establishing respective corresponding relationships between the amplitude attenuation degree and the lithium-ion battery SOC at different charging and discharging currents to obtain respective gauging maps; and secondly, during use of a lithium-ion battery, monitoring respective amplitude attenuation degrees of the ultrasonic waves with the specific frequency and amplitude passing through the lithium-ion battery at different charging and discharging currents, obtaining respective corresponding relationships between the amplitude attenuation degree of the ultrasonic waves with the specific frequency and amplitude and the SOC according to the gauging maps, and then estimating SOC of the lithium-ion battery.

The principle of the above inventive concept is that for a certain battery, in the gauging process, the current, the SOC and the amplitude of ultrasonic waves passing through the battery are all known quantities that can be measured, and the studies showed that there is an objective corresponding relationship between the three parameters. During use of the battery, the battery SOC cannot be obtained directly. According to the above method, the battery SOC can be estimated by measuring the current and the amplitude of ultrasonic waves passing through the battery.

Amplitudes of ultrasonic waves passing through the battery in different SOCs are different, which is the basis for the establishment of the above invention. The reason is that the chemical compositions of the positive and negative materials inside the lithium-ion battery in different SOCs are different, and the positive and negative material particles will undergo volume changes in the charging and discharging process, resulting in changes in compactness of the particles accumulation inside the electrode sheets. As a result, the overall absorption rate of the battery on the acoustic energy changes, which shows up as the change in amplitude of the ultrasonic wave passing through the battery.

Further, the method comprises: firstly, passing ultrasonic waves through a lithium-ion battery in different SOCs at different charging and discharging currents to obtain respective flight times, and then establishing respective corresponding relationships between the flight time and the lithium-ion battery SOC at different charging and discharging currents to obtain respective gauging maps; and secondly, during use of a lithium-ion battery, monitoring respective flight times of the ultrasonic waves passing through the lithium-ion battery at different charging and discharging currents, obtaining respective corresponding relationships between the flight time of the ultrasonic wave and the lithium-ion battery SOC at different charging and discharging currents according to the gauging maps, and then estimating SOC of the lithium-ion battery.

The principle of the above inventive concept is that for a certain battery, in the gauging process, the current, the SOC and the flight time of the ultrasonic wave passing through the battery are all known quantities that can be measured, and the studies showed that there is an objective corresponding relationship between the three parameters. During use of the battery, the battery SOC cannot be obtained directly. According to the above method, the battery SOC can be estimated by measuring the current and the flight time of the ultrasonic wave passing through the battery.

Flight times of ultrasonic waves passing through the battery in different SOCs are different, which is the basis for the establishment of the above invention. The reason is that the chemical compositions of the positive and negative materials inside the lithium-ion battery in different SOCs are different, and the positive and negative material particles will undergo volume changes in the charging and discharging process, resulting in changes in compactness of the particles accumulation inside the electrode sheets. As a result, the average propagation speed of ultrasonic waves in the battery changes, which shows up as the change in the flight time of ultrasonic waves passing through the battery.

Further, the method comprises: firstly, passing ultrasonic waves with a specific frequency and amplitude through a healthy lithium-ion battery in different SOCs at different charging and discharging currents to obtain respective amplitude attenuation degrees of the ultrasonic waves with the specific frequency and amplitude, and then to obtain respective amplitudes of the ultrasonic waves passing through the healthy lithium-ion battery at different charging and discharging currents; and secondly, passing ultrasonic waves with the specific frequency and amplitude through a lithium-ion battery in different SOCs at different charging and discharging currents to monitor amplitudes of the ultrasonic waves with the specific frequency and amplitude passing through the lithium-ion battery, so that if the monitored amplitudes decrease abnormally compared to that of the healthy lithium-ion battery, it is determined that the lithium-ion battery SOH is poor.

Further, the method comprises: firstly, passing ultrasonic waves through a healthy lithium-ion battery in different SOCs at different charging and discharging currents to obtain respective flight times of a specific wave peak in the ultrasonic waves, and then to obtain respective flight times of the specific wave peak passing through the healthy lithium-ion battery at different charging and discharging currents; and secondly, passing ultrasonic waves through a lithium-ion battery in different SOCs at different charging and discharging currents to monitor respective flight times of the specific wave peak passing through the lithium-ion battery, so that if the monitored flight times increase abnormally compared to that of the healthy lithium-ion battery, it is determined that the lithium-ion battery SOH is poor.

Further, the method comprises: firstly, passing ultrasonic waves through a healthy lithium-ion battery in different SOCs at different charging and discharging currents, and recording ultrasonic signals passing through the lithium-ion battery to obtain reference acoustic fingerprints; and secondly, passing ultrasonic waves through a lithium-ion battery in different SOCs at different charging and discharging currents to obtain detection acoustic fingerprints, so that if the difference between the detection acoustic fingerprint and the reference acoustic fingerprint exceeds a set value, it is determined that the lithium-ion battery SOH is poor.

The principle of the above inventive concept is that for a certain battery, in the gauging process, the amplitude, waveform and flight time of the ultrasonic wave passing through the battery are all known quantities that can be measured, and deterioration of the battery SOH can cause dramatic changes in the amplitude, waveform, and flight time of the ultrasonic wave passing through the battery. The battery SOH does not directly correspond to the physical quantity, but it can be reflected by indirect quantities. According to the above method, the amplitude, waveform and flight time of the ultrasonic wave passing through the battery can be measured, which can indirectly reflect the change of the battery SOH. When the amplitude, waveform and flight time of the ultrasonic wave passing through the battery are greatly changed, an early warning that the battery SOH is poor can be given.

According to another aspect of the present invention, there is further provided a device for implementing the methods described above, comprising an ultrasonic signal source and an ultrasonic signal receiver, in which the ultrasonic signal source and the ultrasonic signal receiver are respectively located on both sides of a Lithium-ion battery to be monitored, the ultrasonic signal source is used for emitting ultrasonic waves, and the ultrasonic signal receiver is used for receiving and recording the amplitude, flight time, and acoustic fingerprint of the ultrasonic waves.

In general, compared with the prior art, the present invention has the following beneficial effects:

In the present invention, an ultrasonic method is used to measure amplitude attenuation degrees, flight times (propagation time of an ultrasonic wave from the ultrasonic signal source to the ultrasonic signal receiver) and acoustic fingerprints (waveform of an ultrasonic wave passing a battery) of ultrasonic waves passing through a battery in different SOCs at different charging and discharging currents from the acoustic perspective so as to measure the battery SOC and monitor the battery SOH.

In the present invention, the change of the internal electrodes during the battery charging and discharging can be more directly obtained through the ultrasonic method, and thus, SOC and SOH of a battery can be estimated in a new way different from the electrical parameter measurement. Tests showed that the method of the present invention can effectively measure the battery SOC and monitor the battery SOH, can be applied to lithium-ion batteries of various types and shapes, and thus has a good application prospect.

BRIEF DESCRIPTION OF THE DRAWINGS

In all figures, the same elements or structures are denoted by the same reference numerals, in which.

Figure 1:
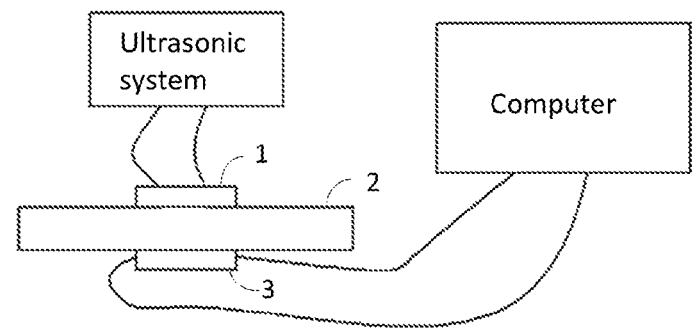
FIG. 1 is a schematic diagram of a device for detecting SOC and SOH of a battery according to embodiments of the present invention.

1: ultrasonic signal resource 2: battery 3: ultrasonic signal receiver

DETAILED DESCRIPTION OF THE EMBODIMENTS

For clear understanding of the objectives, features and advantages of the present invention, detailed description of the present invention will be given below in conjunction with accompanying drawings and specific embodiments. It should be noted that the embodiments described herein are only meant to explain the present invention, and not to limit the scope of the present invention.

A large number of studies showed that the attenuation amplitude degree of the ultrasonic wave passing through a lithium-ion battery decreases as the battery SOC increases, and the flight time of the ultrasonic wave decreases as the battery SOC increases. Meanwhile, for the same battery, the peak position at different battery SOCs is similar to that of the waveform (the acoustic fingerprint can be extracted). This means that SOC and SOH of a battery can be estimated by an ultrasonic method. Therefore, based on the above rules, the present invention proposes a brand-new method for measuring SOC and SOH of a battery and provides a corresponding device.

In the method of the present invention, the method for monitoring the battery SOC by the amplitude attenuation degree of the ultrasonic wave passing through the lithium-ion battery is as follows: firstly, gauging respective amplitudes of ultrasonic waves with a specific frequency and amplitude passing through a battery in different SOCs at different charging and discharging currents, and establishing respective corresponding relationships between the amplitude of the ultrasonic wave passing through the battery and the current and SOC, and secondly, during use, monitoring an amplitude of an ultrasonic wave with the specific frequency and amplitude passing through a battery, comparing it with the corresponding relationship between the amplitude and the SOC at this current obtained in the gauging process, and then estimating the battery SOC.

In the method of the present invention, the method for monitoring the battery SOC by the flight time of the ultrasonic wave is as follows: firstly, gauging respective flight times of ultrasonic waves with a specific frequency and amplitude passing through a battery in different SOCs at different charging and discharging currents, and establishing respective corresponding relationships between the flight time of the ultrasonic wave passing through the battery and the current and SOC, and secondly, during use, monitoring a flight time of an ultrasonic wave with the specific frequency and amplitude passing through a battery, comparing it with the corresponding relationship between the ultrasonic wave flight time and the SOC at this current obtained in the gauging process, and then estimating the battery SOC.

In the method of the present invention, the method for monitoring the battery SOH by the flight time, amplitude and acoustic fingerprint of the ultrasonic wave is as follows: firstly, gauging amplitudes, waveforms and acoustic fingerprints of ultrasonic waves with a specific frequency and amplitude passing through a battery in different SOCs at different charging and discharging currents, and extracting respective relative invariants of amplitudes, waveforms and acoustic fingerprints of the ultrasonic waves passing through the battery with respect to corresponding currents and battery SOCs; and secondly, during use, monitoring a flight time, an amplitude and an acoustic fingerprint of the ultrasonic wave with the specific frequency and amplitude passing through a battery, comparing them with the relative invariants of the amplitude, waveform and acoustic fingerprint at this current obtained in the gauging process, and calculating the respective differences between the flight time, amplitude and acoustic fingerprint and the extracted respective relative invariants as indicating parameters of the battery SOH, so that when the difference reaches a predetermined value, the battery is considered to in poor state of health and needs to be replaced. The principle of the above design is that for a certain battery, in the gauging process, the amplitude, waveform and flight time of the ultrasonic wave passing through the battery are known quantities that can be measured, and deterioration of the battery SOH may cause dramatic changes in amplitude, waveform and flight time of the ultrasonic wave passing through the battery. The battery SOH does not directly correspond to the physical quantity, but it can be reflected by indirect quantities. According to the method in the present invention, the change in the battery SOH can be indirectly reflected by measuring the amplitude, waveform and flight time of the ultrasonic wave passing through the battery, and when the amplitude, waveform and flight time of the ultrasonic wave passing through the battery are greatly changed, an early warning that the battery SOH is poor can be given.

The principle of the present invention is as follow: the charging and discharging processes of the lithium-ion battery is essentially the insertion and removal of lithium ions in the positive and negative electrodes; with different battery SOCs, there are different lithium contents in the positive and negative electrodes, so that physical quantities, such as density, Young's modulus and crystal structure, of the electrodes are different; the change in acoustic parameters (such as ultrasonic wave amplitude attenuation degree, ultrasonic wave flight time and waveform of the ultrasonic wave passing through a battery) of the battery can directly reflect the physical changes of the internal electrodes of the battery; and thus, SOC and SOH of the battery can be estimated by measuring changes in these acoustic parameters.

FIG. 1 is a schematic diagram of a device for detecting SOC and SOH of a battery according to embodiments of the present invention. As can be seen from the figure, the device includes an ultrasonic signal source 1, a battery 2 and an ultrasonic signal receiver 3, in which the battery 2 is a lithium-ion battery to be monitored; the ultrasonic signal source 1 and the ultrasonic signal receiver 3 are respectively located on both sides of the lithium-ion battery 2 to be monitored; and the ultrasonic signal source 1 is used for emitting ultrasonic waves, and the ultrasonic signal receiver 3 is used for receiving and recording flight time, amplitude and acoustic fingerprint of the ultrasonic wave.

For further illustration of the method and device of the present invention, further description will be given below in conjunction with embodiments.

Embodiment 1

The ultrasonic signal source and the ultrasonic signal receiver are attached to upper and lower surfaces of a soft pack ternary graphite lithium-ion battery (nominal capacity: 5000 mAh, normal charge-discharge interval: 2.8-4.2 V), as shown in FIG. 1. An ultrasonic pulse signal is emitted from the ultrasonic signal source, and in a transmission mode, an ultrasonic signal passing through the battery is monitored by the ultrasonic signal receiver.

Figure 2:
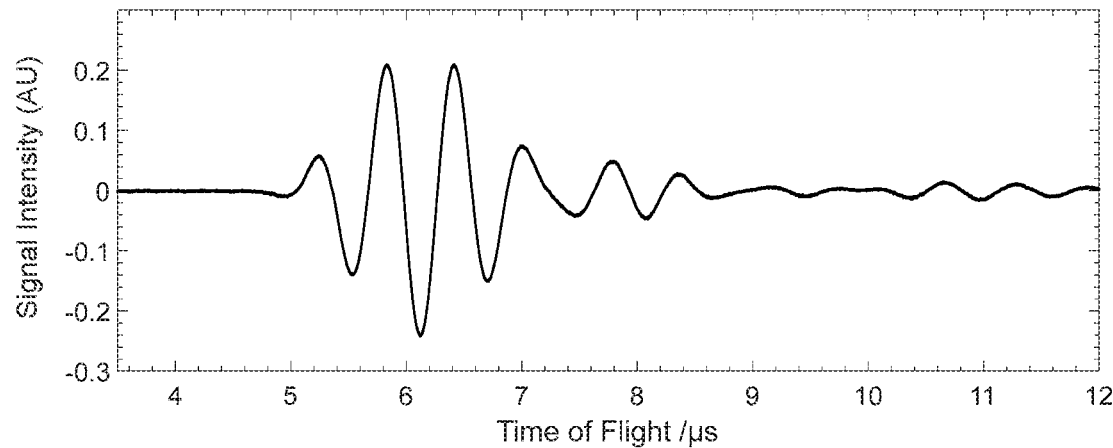
FIG. 2 is diagram showing a waveform (acoustic fingerprint) of an ultrasonic pulse passing through a battery in 50% SOC according to Embodiment 1 of the present invention.

A battery tester is used to charge and discharge the battery at a current of 5 A, and waveforms (i.e., acoustic fingerprints) of ultrasonic pulses passing through the battery in different SOCs are recorded in real time. FIG. 2 is diagram showing a waveform (acoustic fingerprint) of an ultrasonic pulse passing through a battery in 50% SOC according to this embodiment of the present invention, and information such as the maximum peak amplitude and the flight time of the maximum peak ultrasonic wave is extracted from the acoustic fingerprint.

Figure 3:
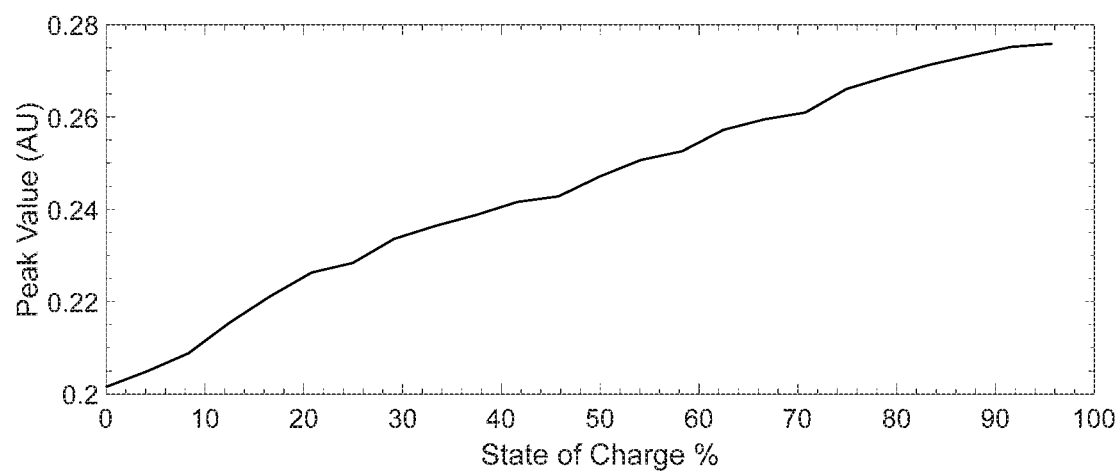
FIG. 3 is a diagram showing a corresponding relationship between the ultrasonic signal peak and the battery SOC in a discharging process according to Embodiment 1 of the present invention.

In the discharging process, a corresponding relationship between the maximum peak amplitude (amplitude attenuation degree) of ultrasonic waves passing through the battery and the battery SOC is shown in FIG. 3. FIG. 3 is a diagram showing a corresponding relationship between the ultrasonic signal peak and the battery SOC in the discharging process according to the embodiment of the present invention.

Figure 4:
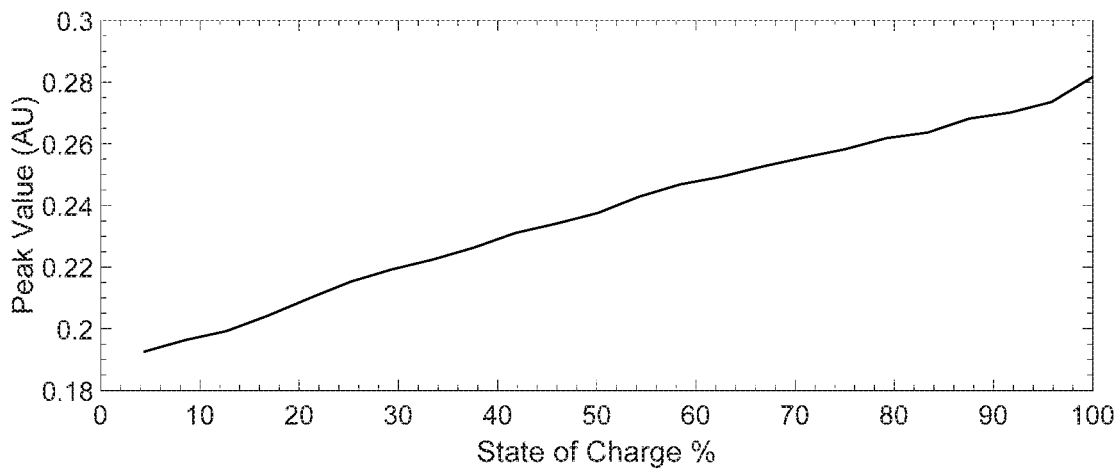
FIG. 4 is a diagram showing a corresponding relationship between the ultrasonic signal peak and the battery SOC in a charging process according to Embodiment 1 of the present invention.

In the charging process, a corresponding relationship between the maximum peak amplitude (amplitude attenuation degree) of the ultrasonic wave passing through the battery and the battery SOC is shown in FIG. 4. FIG. 4 is a diagram showing a corresponding relationship between the ultrasonic signal peak and the battery SOC in the charging process according to embodiments of the present invention.

Then, the lithium-ion battery is subjected to normal circulation of charging and discharging between 2.8 V to 4.2 V for 50 circles, and it can been found that the corresponding relationship between the maximum peak amplitude (amplitude attenuation degree) of the ultrasonic waves passing through the battery and the battery SOC does not change significantly.

As can been seen from FIGS. 3 and 4, with certain charging and discharging currents, the maximum peak amplitude of the transmitted ultrasonic wave is monotonously changed with the battery SOC. In the follow-up battery use process, the battery is charged and discharged with a current of 5 V, the maximum peak amplitudes of the transmitted ultrasonic waves are measured, and then respective corresponding points are found in FIGS. 3 and 4, so that the respective battery SOCs can be obtained.

Figure 5:
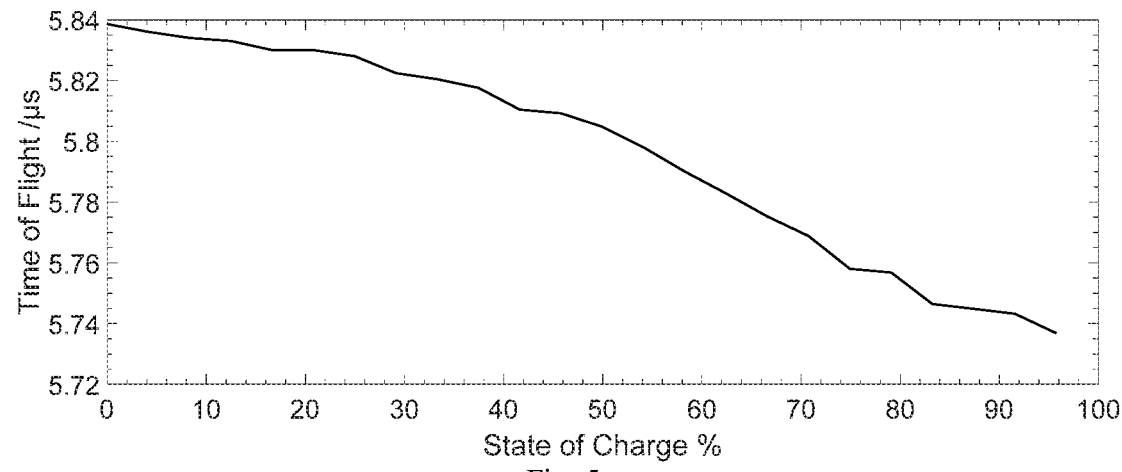
FIG. 5 is a diagram showing a corresponding relationship between the ultrasonic signal flight time and the battery SOC in a discharging process according to Embodiment 1 of the present invention.
Figure 6:
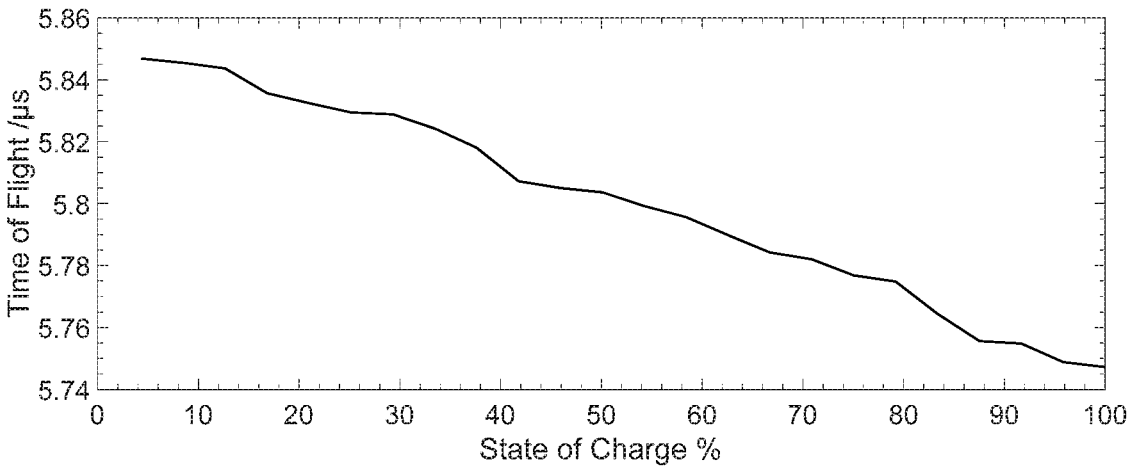
FIG. 6 is a diagram showing a corresponding relationship between the ultrasonic signal flight time and the battery SOC in a charging process according to Embodiment 1 of the present invention.

In addition, according to the same method, it can be known that the corresponding relationships between the flight time of ultrasonic waves and the battery SOC in the charging and discharging processes are respectively shown in FIG. 5 and FIG. 6, in which FIG. 5 is a diagram showing a corresponding relationship between the ultrasonic signal flight time and the battery SOC in a discharging process according to the embodiment of the present invention, and FIG. 6 is a diagram showing a corresponding relationship between the ultrasonic signal flight time and the battery SOC in a charging process according to the embodiment of the present invention. As can been seen from FIGS. 5 and 6, with certain charging and discharging currents, there is also a certain corresponding relationship between the ultrasonic signal flight time and the battery SOC. In the follow-up battery use process, the battery is charged and discharged with a current of 5 V, the respective flight times of the ultrasonic waves passing through the lithium-ion battery are measured, and then respective corresponding points are found in FIGS. 5 and 6, so that the respective battery SOCs can be obtained.

Embodiment 2

The battery in Embodiment 1 is overcharged to 4.25 V for 5 circles such that the battery SOH is damaged to a certain extent and the full charge capacity of the battery is reduced to 60% of the nominal capacity. Then, the damaged battery is tested by a device shown in FIG. 1.

The test result showed that the maximum peak amplitude of the transmitted ultrasonic waves is reduced to one fifth of that of the healthy battery. Thus, during use of the battery, it is found that the maximum peak amplitude of the transmitted ultrasonic waves abnormally decreases, indicating that the battery SOH is poor.

Embodiment 3

The battery in Embodiment 1 is subjected to normal circulation of charging and discharging for 500 circles such that the battery is aged, the battery SOC is damaged to a certain extent and the full charge capacity of the battery is reduced to 80% of the nominal capacity. Then, the aged battery is tested by the device shown in FIG. 1.

Figure 7:
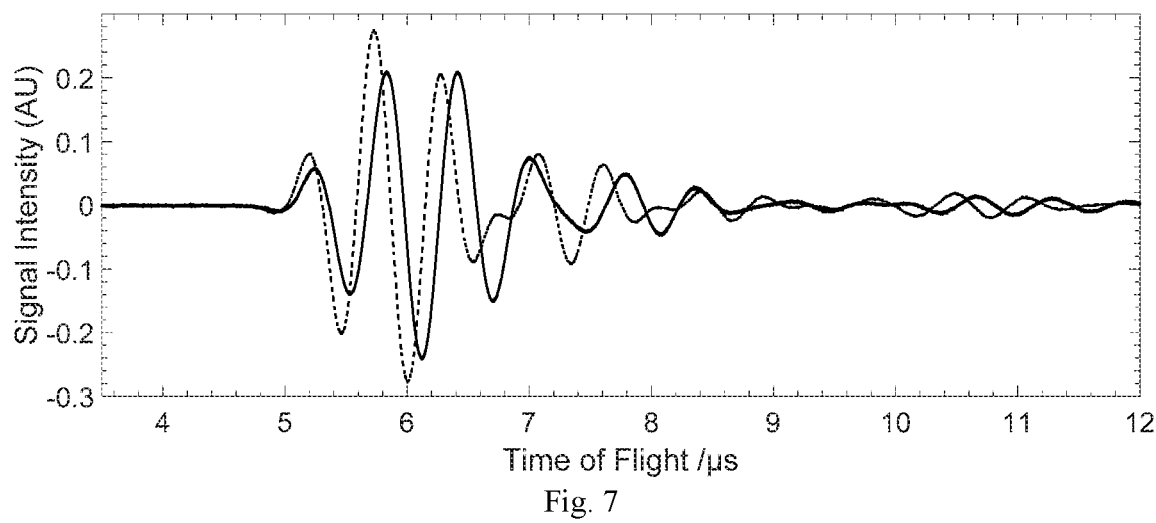
FIG. 7 is a comparison diagram of an acoustic fingerprint in a poor battery SOH and an acoustic fingerprint in a normal battery SOH according to embodiments of the present invention.

The test result shows that the waveform (acoustic fingerprint) of the transmitted ultrasonic waves is obviously changed, as shown in FIG. 7. FIG. 7 is a comparison diagram of an acoustic fingerprint in a poor battery SOH and an acoustic fingerprint in a normal battery SOH according to the embodiment of the present invention, in which the solid line represents an acoustic fingerprint in a normal battery SOH and the dotted line represents an acoustic fingerprint after the battery is aged. When the battery SOH is poor due to the aging of the battery, the fourth and sixth wave peaks are divided and overall left shift abnormally occurs. Therefore, by comparing the waveform of the ultrasonic wave passing through the battery to be detected and the waveform of the ultrasonic wave passing through the healthy battery, it can be determined whether the battery SOH is poor due to the aging of the battery.

In conclusion, the method of the invention is different from the traditional method which uses electrical parameters to measure the battery SOC, and in the present invention, SOC and SOH of the battery are estimated by measuring the change in acoustic parameters of the battery in an ultrasonic manner for the first time. In addition, the measurement process in the present invention is not affected by many factors like the measurement process of electrical parameters, and the detection result is relatively accurate.

While particular embodiments of the present invention have been shown and described, it will be obvious to those skilled in the art that changes and modifications may be made without departing from the spirit and scope of the present invention.

The present invention claimed is:

1. A method for monitoring a state of charge (SOC) and/or state of health (SOH) of a monitored lithium-ion battery, comprising:
   (a) passing an ultrasonic wave through a reference lithium-ion battery in different SOCs at different charging and/or discharging currents, determining a reference acoustic parameter of the ultrasonic wave passed through the reference lithium-ion battery, and then establishing a corresponding relationship between the reference acoustic parameter and a reference SOC and/or SOH of the reference lithium-ion battery, respectively; and
   (b) passing the ultrasonic wave through the monitored lithium-ion battery, determining an acoustic parameter of the ultrasonic wave passed through the monitored lithium-ion battery, and then estimating the SOC and/or SOH of the monitored lithium-ion battery by comparing the acoustic parameter with the corresponding relationship in step (a),
   wherein the acoustic parameter includes at least one selected from the group consisting of an amplitude attenuation degree, a flight time, and an acoustic fingerprint of the ultrasonic wave passed through the monitored lithium-ion battery,
   the reference acoustic parameter includes at least one selected from the group consisting of a reference amplitude attenuation degree, a reference flight time, and a reference acoustic fingerprint of the ultrasonic wave passed through the reference lithium-ion battery,
   the flight time and the reference flight time refer to the time the ultrasonic wave takes to travel from an ultrasonic signal source to an ultrasonic signal receiver,
   the flight time and the reference flight time are measured when the ultrasonic signal source and the ultrasonic signal receiver are in contact with the monitored lithium-ion battery and the reference lithium-ion battery, respectively, and
   the acoustic fingerprint and the reference acoustic fingerprint refer to a waveform of the ultrasonic wave passed through the monitored lithium-ion battery and the reference lithium-ion battery, respectively.

2. The method for monitoring the SOC and/or SOH of the monitored lithium-ion battery of claim 1, wherein the ultrasonic wave has a specific frequency and amplitude, the reference acoustic parameter includes the reference amplitude attenuation degree, the acoustic parameter includes the amplitude attenuation degree, establishing the corresponding relationship in step (a) includes establishing relationships between the reference amplitude attenuation degree and the reference SOC of the reference lithium-ion battery at different charging and discharging currents to obtain respective gauging maps, determining the acoustic parameter in step (b) includes, during the use of the monitored lithium-ion battery, monitoring the amplitude attenuation degree of the ultrasonic wave passed through the monitored lithium-ion battery at different charging and discharging currents, and obtaining a corresponding relationship between the amplitude attenuation degree and the SOC according to the gauging maps, and estimating the SOC and/or SOH of the monitored lithium-ion battery in step (b) includes estimating the SOC of the monitored lithium-ion battery.

3. The method for monitoring the SOC and/or SOH of the monitored lithium-ion battery of claim 1, wherein the reference acoustic parameter includes the reference flight time, the acoustic parameter includes the flight time, establishing the corresponding relationship in step (a) includes establishing relationships between the reference flight time and the reference SOC of the reference lithium-ion battery at different charging and discharging currents to obtain respective gauging maps, determining the acoustic parameter in step (b) includes, during the use of the monitored lithium-ion battery, monitoring the flight time of the ultrasonic wave passed through the monitored lithium-ion battery at different charging and discharging currents, and obtaining corresponding relationships between the flight time and the SOC of the monitored lithium-ion battery at different charging and discharging currents according to the gauging maps, and estimating the SOC and/or SOH of the monitored lithium-ion battery in step (b) including estimating the SOC of the monitored lithium-ion battery.

4. The method for monitoring the SOC and/or SOH of the monitored lithium-ion battery of claim 1, wherein the ultrasonic wave has a specific frequency and amplitude, the reference lithium-ion battery is a healthy lithium-ion battery, the reference acoustic parameter includes the reference amplitude attention degree, establishing the corresponding relationship in step (a) includes obtaining the reference amplitude attenuation degree and then obtaining a reference amplitude of the ultrasonic wave passed through the healthy lithium-ion battery at different charging and discharging currents, determining the acoustic parameter in step (b) includes monitoring an amplitude of the ultrasonic wave passed through the monitored lithium-ion battery, and estimating the SOC and/or SOH of the monitored lithium-ion battery in step (b) includes comparing the amplitude with the reference amplitude, when the amplitude decreases abnormally compared to the reference amplitude, the SOH of the monitored lithium-ion battery is poor.

5. The method for monitoring the SOC and/or SOH of the monitored lithium-ion battery of claim 1, wherein the reference lithium-ion battery is a healthy lithium-ion battery, the reference acoustic parameter includes the reference flight time, the acoustic parameter includes the flight time, establishing the corresponding relationship in step (a) includes obtaining the reference flight time of a specific wave peak of the ultrasonic wave passed through the healthy lithium-ion battery at different charging and discharging currents, determining the acoustic parameter in step (b) includes passing the ultrasonic wave through the monitored lithium-ion battery in different SOCs at different charging and discharging currents to monitor the flight time of the specific wave peak passed through the monitored lithium-ion battery, and estimating the SOC and/or SOH of the monitored lithium-ion battery in step (b) includes comparing the flight time with the reference flight time, when the flight time increases abnormally compared to the reference flight time, the SOH of the monitored lithium-ion battery is poor.

6. The method for monitoring the SOC and/or SOH of the monitored lithium-ion battery of claim 1, wherein the reference lithium-ion battery is a healthy lithium-ion battery, the reference acoustic parameter includes the reference acoustic fingerprint, the acoustic parameter includes the acoustic fingerprint, establishing the corresponding relationship in step (a) includes obtaining the reference acoustic fingerprint of the ultrasonic wave passed through the healthy lithium-ion battery at different charging and discharging currents, determining the acoustic parameter in step (b) includes passing the ultrasonic wave through the monitored lithium-ion battery in different SOCs at different charging and discharging currents to obtain the acoustic fingerprint of the ultrasonic wave passed through the monitored lithium-ion battery, and estimating the SOC and/or SOH of the monitored lithium-ion battery in step (b) includes comparing the acoustic fingerprint with the reference acoustic fingerprint, when the difference between the acoustic fingerprint and the reference acoustic fingerprint exceeds a set value, the SOH of the monitored lithium-ion battery is poor.

\* \* \* \* \*